(12) United States Patent
Kuramochi

(10) Patent No.: US 8,081,096 B2
(45) Date of Patent: Dec. 20, 2011

(54) SIGNAL GENERATING APPARATUS AND TEST APPARATUS

(75) Inventor: Yasuhide Kuramochi, Gunma (JP)

(73) Assignee: Advantest Corporation, Tokyo (JP)

( * ) Notice: Subject to any disclaimer, the term of this patent is extended or adjusted under 35 U.S.C. 154(b) by 135 days.

(21) Appl. No.: 12/633,666

(22) Filed: Dec. 8, 2009

(65) Prior Publication Data

US 2011/0133751 A1    Jun. 9, 2011

(51) Int. Cl.
*H03M 1/10*    (2006.01)
(52) U.S. Cl. .................................... 341/120; 341/161
(58) Field of Classification Search .................. 341/120, 341/121, 161, 156, 155
See application file for complete search history.

(56) References Cited

U.S. PATENT DOCUMENTS

| | | | |
|---|---|---|---|
| 4,947,168 A * | 8/1990 | Myers | 341/120 |
| 5,153,592 A | 10/1992 | Fairchild et al. | |
| 5,659,312 A | 8/1997 | Sunter et al. | |
| 6,476,742 B2 * | 11/2002 | Yamaguchi | 341/120 |
| 6,549,150 B1 | 4/2003 | Bulaga et al. | |

FOREIGN PATENT DOCUMENTS

JP    3382818 B2    1/1999

* cited by examiner

*Primary Examiner* — Joseph Lauture
(74) *Attorney, Agent, or Firm* — Chen Yoshimura LLP

(57) ABSTRACT

Provided is a signal generating apparatus comprising a DA converter that outputs an output signal corresponding to input data supplied thereto; a sample/hold unit that is provided between the DA converter and an output end of the signal generating apparatus, and that samples an output voltage of the DA converter and holds the sampled output voltage; a comparing section that compares (i) a level of a signal output from an analog circuit that propagates the output signal to output a signal corresponding to the input data to (ii) a level of the signal output by the DA converter; and a control section that, during a holding period, (iii) provides the DA converter with comparison data instead of the input data to cause the DA converter to output a comparison voltage corresponding to the comparison data, (iv) causes the comparing section to compare a voltage of the signal output by the analog circuit to the comparison voltage, and (v) adjusts the output voltage of the DA converter according to the input data based on a comparison result of the comparing section.

20 Claims, 8 Drawing Sheets

SIGNAL GENERATING APPARATUS AND TEST APPARATUS

BACKGROUND

1. Technical Field

The present invention relates to a signal generating apparatus and a test apparatus.

2. Related Art

A signal generating apparatus is known that outputs an analog signal corresponding to data supplied thereto. When the signal output from the signal generating apparatus is supplied to a target circuit via an analog circuit such as a filter, the analog circuit causes distortion, attenuation, and the like. By outputting a signal in which the distortion and attenuation caused by the analog circuit is compensated for in advance, the signal generating apparatus can supply the target circuit with a signal having the desired level.

However, the amount of distortion and attenuation caused by the analog circuit changes according to the environment during signal generation. If the output signal of the analog circuit is measured in the background using an AD converter or the like during signal generation, the signal generating apparatus can perform accurate compensation that follows the fluctuation in the distortion and attenuation amounts of the analog circuit. Providing the signal generating apparatus with an AD converter that is separate from the signal generating functions, however, results in a larger structure and a higher cost.

Patent Document 1: U.S. Pat. No. 5,659,312
Patent Document 2: U.S. Pat. No. 5,153,592
Patent Document 3: Japanese Patent No. 3382818
Patent Document 4: U.S. Pat. No. 6,549,150

SUMMARY

Therefore, it is an object of an aspect of the innovations herein to provide a signal generating apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal generating apparatus and test apparatus may include (i) a signal generating apparatus comprising a DA converter that outputs an output signal corresponding to input data supplied thereto; a comparing section that compares a level of a signal output from an analog circuit that propagates the output signal to output a signal corresponding to the input data to a level of the signal output by the DA converter; and a control section that adjusts the output signal of the DA converter based on a comparison result of the comparing section and (ii) a test apparatus provided with the signal generating apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
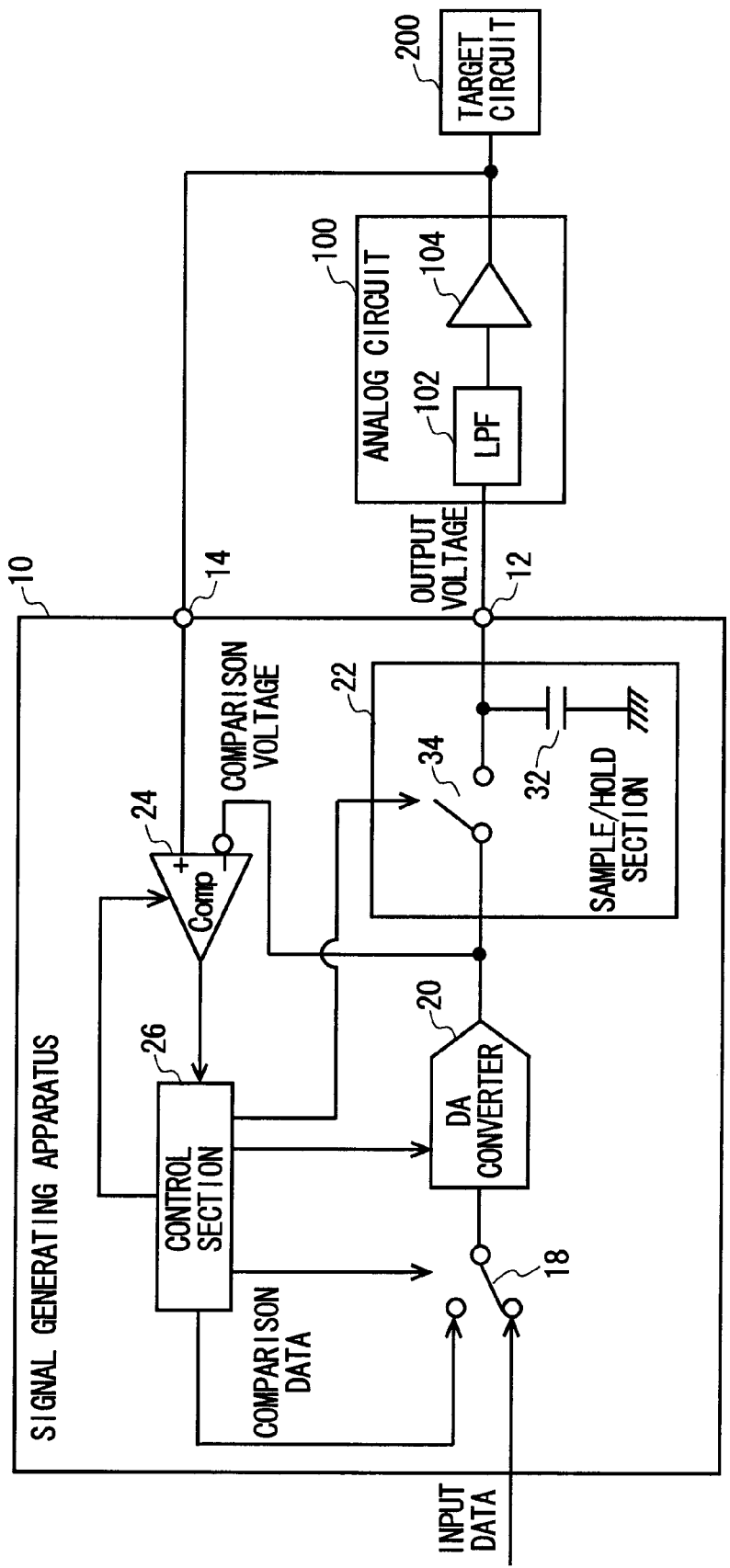
FIG. 1 shows a configuration of a signal generating apparatus 10 according to an embodiment of the present invention, along with an analog circuit 100 and a target circuit 200.

FIG. 1 shows a configuration of a signal generating apparatus 10 according to an embodiment of the present invention, along with an analog circuit 100 and a target circuit 200. The signal generating apparatus 10 outputs an output signal having a level that corresponds to input data supplied from the outside. In the present embodiment, the signal generating apparatus 10 outputs an output voltage that corresponds to the input data.

The output signal from the signal generating apparatus 10 is supplied to the target circuit 200 via the analog circuit 100. The analog circuit 100 propagates the output signal and outputs a signal corresponding to the input data. The analog circuit 100 may be a transmission line, for example. The analog circuit 100 may include a low-pass filter 102 that eliminates a high frequency component from the output signal and a buffer amplifier 104 that supplies the target circuit 200 with the signal output from the low-pass filter 102.

The analog circuit 100 may be formed integrally with the signal generating apparatus 10 on the same chip or substrate. The analog circuit 100 may instead be provided within the signal generating apparatus 10.

The signal generating apparatus 10 includes a data switching section 18, a DA converter 20, a sample/hold unit 22, a comparing section 24, and a control section 26. The data switching section 18 selects one of input data and comparison data, and supplies the selected data to the DA converter 20.

The DA converter 20 outputs an output signal corresponding to the input data supplied thereto. In the present embodiment, the DA converter 20 outputs an output voltage corresponding to the input data supplied thereto. If the DA converter 20 is supplied with comparison data instead of input data, the DA converter 20 outputs a comparison voltage corresponding to the comparison data. The DA converter 20 may be a charge redistribution DA converter.

The sample/hold unit 22 is provided between the DA converter 20 and an output end 12 of the signal generating apparatus 10. The sample/hold unit 22 samples the output voltage from the DA converter 20 and holds the sampled output voltage.

The sample/hold unit 22 may include a capacitor section 32 and a switch 34. The capacitor section 32 is provided between the output end 12 of the signal generating apparatus 10 and a reference potential, e.g. a ground.

The switch 34 provides a connection or a disconnect between the DA converter 20 and the output end 12 of the signal generating apparatus 10. More specifically, during a sampling period that involves sampling the output voltage of the DA converter 20, the switch 34 provides a connection between the DA converter 20 and the output end 12 of the signal generating apparatus 10. During a holding period that involves holding the sampled output voltage, the switch 34 disconnects the DA converter 20 from the output end 12 of the signal generating apparatus 10.

This sample/hold unit 22 connects the DA converter 20 and the output end 12 during the sampling period so that the output voltage from the DA converter 20 can be sampled in the capacitor section 32. This sample/hold unit 22 disconnects the DA converter 20 form the output end 12 of the signal generating apparatus 10 during the holding period so that the output voltage sampled in the capacitor section 32 can be output from the output end 12.

The comparing section 24 receives the signal output by the analog circuit 100 via the detection end 14. The comparing section 24 compares the level of the signal output by the analog circuit 100 to the level of the signal output by the DA converter 20. In the present embodiment, the comparing section 24 compares the voltage of the signal output by the analog circuit 100 to the voltage of the signal output by the DA converter 20, and outputs a comparison result indicating which voltage is larger.

The control section 26 controls the timing of the sampling and holding periods of the sample/hold unit 22 by controlling whether the switch 34 provides a connection or a disconnect. The control section 26 also controls the timing at which the comparing section 24 performs the comparison.

The control section 26 generates comparison data to be supplied to the DA converter 20 in place of the input data. The control section 26 controls the data switching section 18 to switch whether the DA converter 20 is provided with input data received from the outside or with comparison data generated by the control section 26.

This control section 26 causes the sample/hold unit 22 to repeatedly alternate between sampling and holding. The control section 26 provides the DA converter 20 with the input data received from the outside during the sampling period of the sample/hold unit 22, and causes the DA converter 20 to output an output voltage corresponding to the input data.

The control section 26 supplies the DA converter 20 with the comparison data instead of the input data during the holding period, and causes the DA converter 20 to output a comparison voltage corresponding to the comparison data. Furthermore, during the holding period, the control section 26 causes the comparing section 24 to compare the voltage of the signal output by the analog circuit 100 to the comparison voltage, which corresponds to the comparison data, output by the DA converter 20. The control section 26 acquires the comparison result from the comparing section 24.

The control section 26 detects the voltage of the signal output from the analog circuit 100 based on the comparison result acquired from the comparing section 24. For example, the control section 26 causes the comparing section 24 to output a plurality of comparison results by changing the comparison data supplied to the DA converter 20, and detects the voltage of the signal output from the analog circuit 100 based on the plurality of comparison results.

The control section 26 may cause the DA converter 20 to output comparison voltages at prescribed increasing or decreasing steps by increasing or decreasing the comparison data by one at a time. The control section 26 then determines the voltage of the signal output from the analog circuit 100 based on the comparison data corresponding to a point at which the comparison result changes.

Instead, the control section 26 may change the comparison data according to the rules of a binary search. The control section 26 then determines the voltage of the signal output by the analog circuit 100 based on the comparison data after a prescribed number of changes.

The control section 26 adjusts the output signal output by the DA converter 20 according to the input data, based on the comparison results of the comparing section 24. For example, the control section 26 adjusts the output voltage output by the DA converter 20 according to the input data, based on the voltage that was detected based on the comparison results of the comparing section 24.

The control section 26 may adjust the output voltage from the DA converter 20 to compensate in advance for the distortion and attenuation caused by the analog circuit 100. In other words, when prescribed input data is supplied from the outside, the control section 26 adjusts the characteristics of the DA converter 20 such that the signal output from the analog circuit 100 has a voltage corresponding to the prescribed input data. For example, the control section 26 adjusts at least one of the offset characteristic and the gain characteristic of the output voltage from the DA converter 20 according to the input data.

The control section 26 does not adjust the output voltage when comparison data is supplied to the DA converter 20, and only adjusts the output voltage when the DA converter 20 outputs a voltage according to the input data. In other words, the control section 26 does not adjust the output voltage at the detection timing of the voltage of the signal output from the analog circuit 100. A detailed example of the control section 26 adjusting the output voltage from the DA converter 20 according to the input data is provided further below.

The signal generating apparatus 10 described above can measure the level, e.g. voltage, of the output signal of the analog circuit 100 in the background during signal generation, without being provided with a separate AD converter or the like. Accordingly, even when the characteristics of the analog circuit 100 fluctuate during signal generation, the signal generating apparatus 10 can reliably supply an accurate signal to the target circuit 200.

Figure 2:
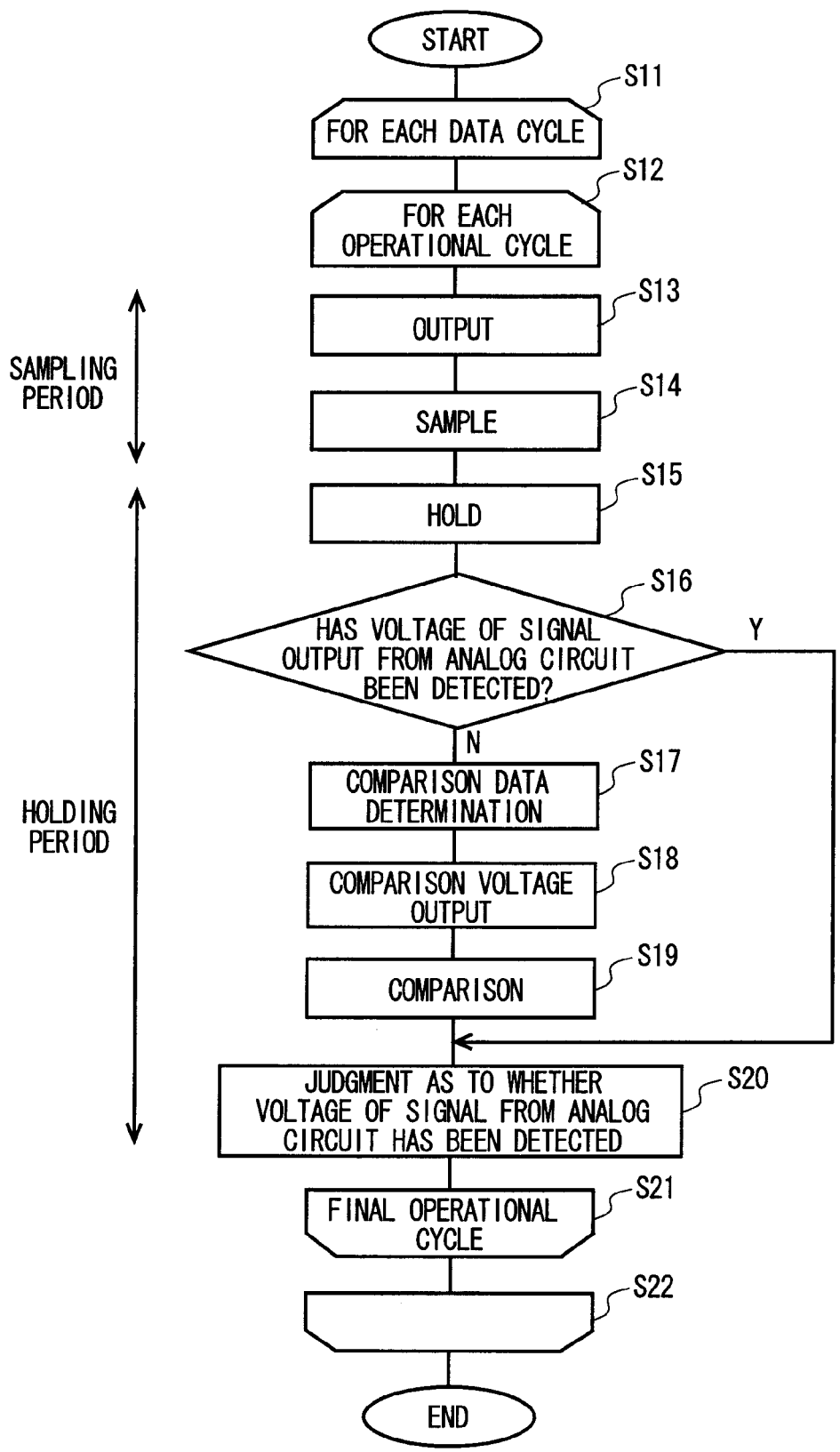
FIG. 2 shows a process flow of the signal generating apparatus 10 according to the present embodiment.

FIG. 2 shows a process flow of the signal generating apparatus 10 according to the present embodiment. The signal generating apparatus 10 performs the processes shown in FIG. 2 during signal generation.

First, during signal generation, the signal generating apparatus 10 receives input data from the outside at prescribed data cycles. The signal generating apparatus 10 then performs the processes from step S12 to step S21 for each prescribed data cycle (the loop process from S11 to S22).

Each data cycle is divided into one or more operational cycles. Each operational cycle may be a period of the clock signal or a prescribed number of periods of the clock signal. For each operational cycle, the signal generating apparatus 10 repeatedly performs the processes from step S13 to step S20 (the process loop between S12 and S21).

For each operational cycle, the control section 26 causes the DA converter 20 to output an output voltage corresponding to the input data supplied from the outside (S13). In this way, the DA converter 20 repeatedly outputs an output voltage corresponding to the supplied input data for each operational cycle.

The control section 26 then causes the sample/hold unit 22 to sample the output voltage from the DA converter 20 (S14). More specifically, the control section 26 controls the switch 34 to provide a connection between the DA converter 20 and the output end 12 of the signal generating apparatus 10, thereby charging a set voltage in the capacitor section 32. In this way, the sample/hold unit 22 can sample the output voltage from the DA converter 20 for each operational cycle.

Next, the control section 26 causes the sample/hold unit 22 to hold the sampled output voltage (S15). More specifically, the control section 26 controls the switch 34 to disconnect the DA converter 20 from the output end 12 of the signal generating apparatus 10, thereby holding the set voltage charged in the capacitor section 32. In this way, the sample/hold unit 22 can output the sampled output voltage from the output end 12 for each operational cycle.

Next, the control section 26 determines whether the voltage of the signal output from the analog circuit 100 has been detected in each operational cycle of the data cycle preceding the current operational cycle (S16). When the control section 26 determines that the voltage of the signal output from the analog circuit 100 has been detected (the "Yes" of step S16), the process moves to step S21. When the control section 26 determines that the voltage of the signal output from the analog circuit 100 has yet to be detected (the "No" of step S16), the process moves to step S17.

Next, the control section 26 determines the comparison data to be output from the DA converter 20 (S17). For example, the control section 26 determines the comparison data of the current operational cycle to be a value obtained by adding 1 to or subtracting 1 from the comparison data determined for the immediately prior operational cycle. The control section 26 may instead determine the comparison data of the current operational cycle according to a binary search based on a comparison result obtained during the previous operational cycle and the comparison data determined for the previous operational cycle.

Next, the control section 26 provides the DA converter 20 with the comparison data determined in step S17, instead of the input data, to cause the DA converter 20 to output a comparison voltage corresponding to the comparison data (S18). This step takes place during the holding period in which the DA converter 20 is disconnected from the output end 12 of the signal generating apparatus 10, and so the comparison voltage output from the DA converter 20 is supplied only to the comparing section 24, and is not output form the output end 12.

Next, the control section 26 compares (i) the voltage of the signal output from the analog circuit 100 to the comparing section 24 to (ii) the comparison voltage output from the DA converter 20 (S19). In this way, the control section 26 can obtain a comparison result between the voltage of the signal output from the analog circuit 100 and the comparison voltage corresponding to the comparison data.

Next, the control section 26 determines whether the voltage output from the analog circuit 100 has been detected (S20). For example, when 1 is added to or subtracted from the comparison data for each operational cycle, the control section 26 determines that the voltage of the signal output from the analog circuit 100 has been detected on a condition that the comparison result has changed from the comparison result of the immediately prior operational cycle. As another example, when the comparison data changes according to the rules of a binary search, the control section 26 may determine that the voltage of the signal output from the analog circuit 100 has been detected on a condition that the value of the comparison data is designated to the least significant bit.

The signal generating apparatus 10 repeats the processes of step S13 to step S20 for each operational cycle. Upon finishing the process for the final operational cycle (S21), the process returns to step S11 and the signal generating apparatus 10 begins processing the next data cycle.

Figure 3:
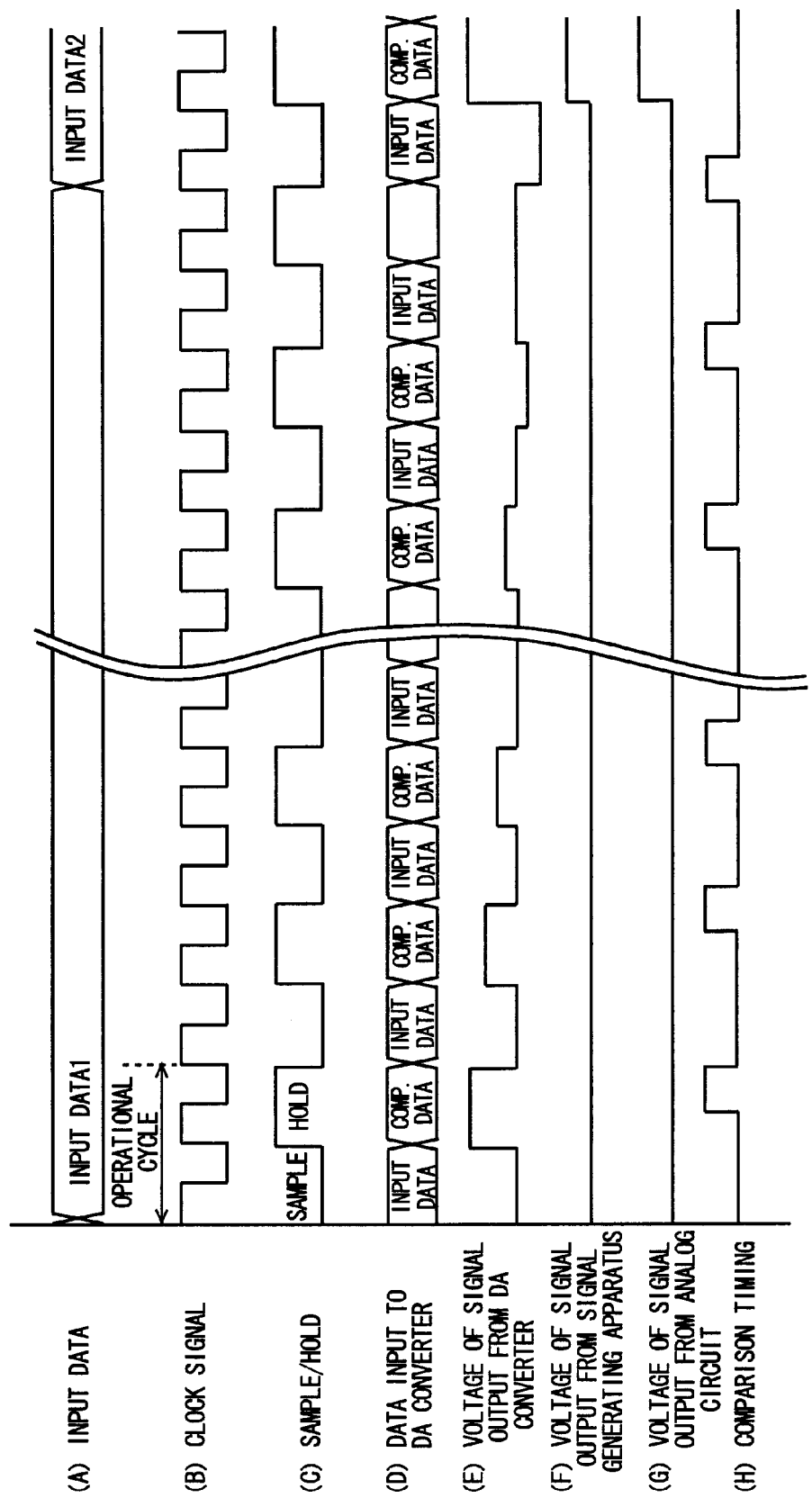
FIG. 3 shows a first exemplary timing chart of each signal in the signal generating apparatus 10 according to the present embodiment.

FIG. 3 shows a first exemplary timing chart of each signal in the signal generating apparatus 10 according to the present embodiment. As shown by (A) and (B) in FIG. 3, the data cycle is divided into a plurality of operational cycles.

As shown by (C) in FIG. 3, the sample/hold unit 22 samples the output voltage of the DA converter 20 during the first half of each operational cycle and holds the sampled output voltage during the second half of each operational cycle.

As shown by (D) in FIG. 3, the DA converter 20 is provided with the input data during the sampling period and is provided with the comparison data during the holding period. Accordingly, as shown by (E) in FIG. 3, the DA converter 20 outputs a comparison voltage corresponding to the comparison data for each holding period in each operational cycle.

Within a single data cycle, the input data supplied to the DA converter 20 does not change. Therefore, as shown by (F) in FIG. 3, the output voltage from the output end 12 in each operational cycle remains constant within a single data cycle. In the same way, as shown by (G) in FIG. 3, the voltage of the signal output from the analog circuit 100 is constant over each operational cycle within a single data cycle.

As shown by (H) in FIG. 3, the control section 26 causes the comparing section 24 to compare, one time during the holding period of each cycle, the voltage of the signal output from the analog circuit 100 to the comparison voltage. For each operational cycle, the control section 26 changes the comparison data supplied to the DA converter 20 according to a prescribed rule.

In other words, the control section 26 changes the comparison data supplied to the DA converter 20 over a plurality of operational cycles according to a prescribed rule. In this way, the control section 26 can detect the level of the signal output from the analog circuit 100 based on a plurality of comparison results between (i) the fixed level of the signal output from the analog circuit 100 and (ii) a plurality of comparison voltages corresponding to different pieces of comparison data.

When the analog circuit 100 is a circuit that attenuates the signal supplied thereto, for example, the control section 26 may supply the DA converter 20 with comparison data obtained by subtracting 1 for each operational cycle from a value corresponding to the input data supplied to the DA converter 20 during this data cycle. In this way, the control section 26 can detect the voltage of the signal output from the analog circuit 100 by detecting the transition point at which the comparison voltage becomes less than or equal to the voltage of the signal output by the analog circuit 100.

As another example, if the analog circuit 100 is an amplification circuit or the like that amplifies the output signal, the control section 26 may supply the DA converter 20 with comparison data obtained by adding 1 for each operational cycle to a value corresponding to the input data acquired during this data cycle. In this way, the control section 26 can detect the level of the signal output from the analog circuit 100 by detecting the transition point at which the comparison voltage becomes greater than the level of the signal output by the analog circuit 100.

The control section 26 may change the comparison data supplied to the DA converter 20 according to the rules of a binary search. In this way, the control section 26 can detect the level of the signal output from the analog circuit 100 based on at least a number of operational cycles corresponding to the number bits of comparison data.

Figure 4:
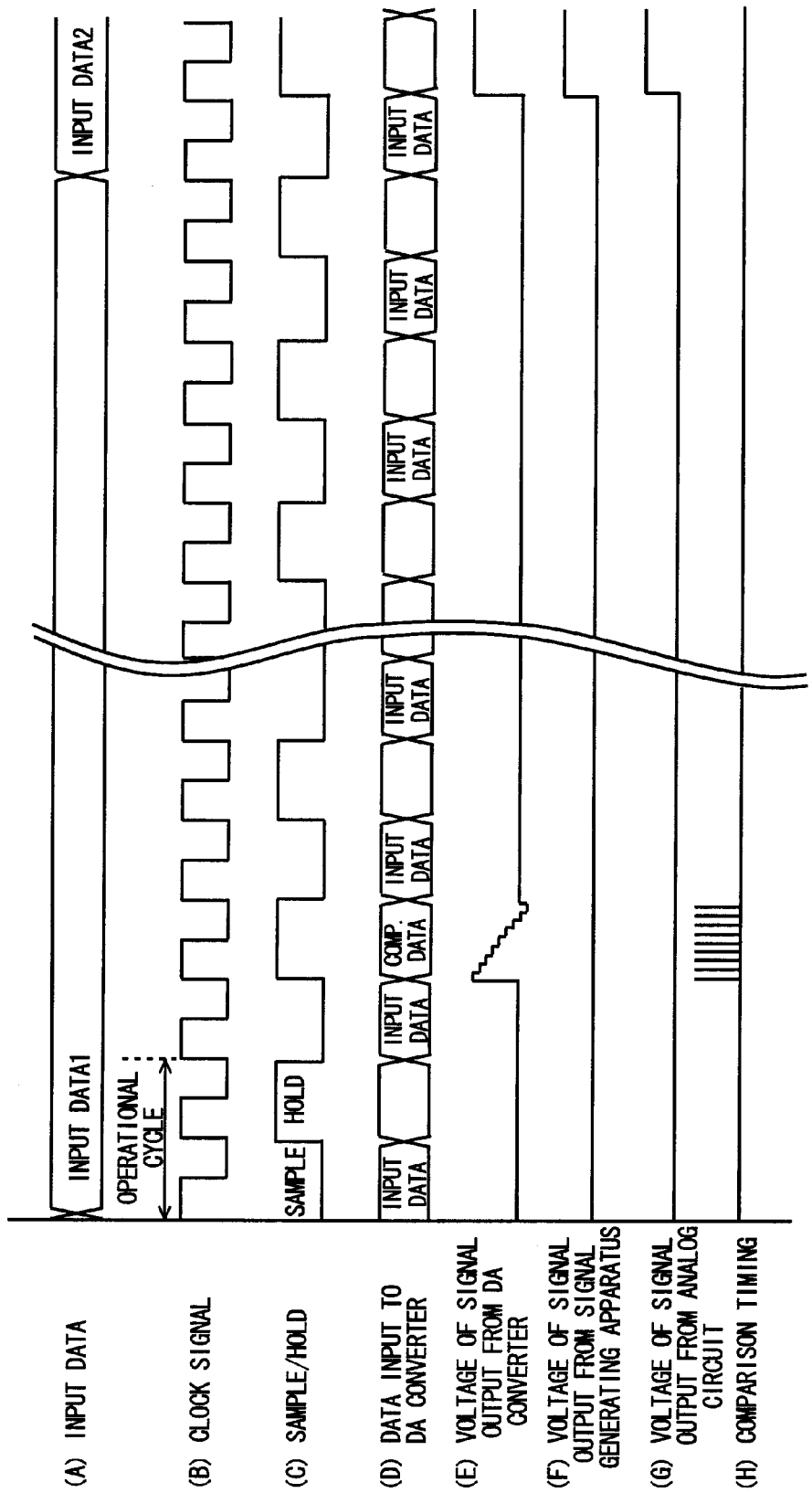
FIG. 4 shows a second exemplary timing chart of each signal in the signal generating apparatus 10 according to the present embodiment.

FIG. 4 shows a second exemplary timing chart of each signal in the signal generating apparatus 10 according to the present embodiment. As shown by (E) in FIG. 4, the control section 26 may change the comparison data supplied to the DA converter 20 according to a prescribed rule in synchronization with a sampling clock that is sufficiently faster than the operational cycle in one operational cycle of the data cycle. In other words, the control section 26 may change the comparison data supplied to the DA converter 20 according to a prescribed rule within one operational cycle.

As shown by (H) in FIG. 4, at each timing that comparison data is supplied to the DA converter 20, the control section 26 causes the comparing section 24 to compare the voltage of the signal output by the analog circuit 100 to the comparison voltage. In this way, the control section 26 can detect the voltage of the signal output from the analog circuit 100 based on a plurality of comparison results between (i) the voltage of the signal output from the analog circuit 100 and (ii) each of a plurality of comparison voltages corresponding to a plurality of different pieces of comparison data.

For example, in the same way as shown in FIG. 3, the control section 26 may supply the DA converter 20 with comparison data obtained by, for each operational cycle, subtracting 1 from or adding 1 to a value corresponding to the input data supplied to the DA converter 20 during this data cycle. As another example, the control section 26 may change the comparison data supplied to the DA converter 20 according to the rules of a binary search.

Figure 5:
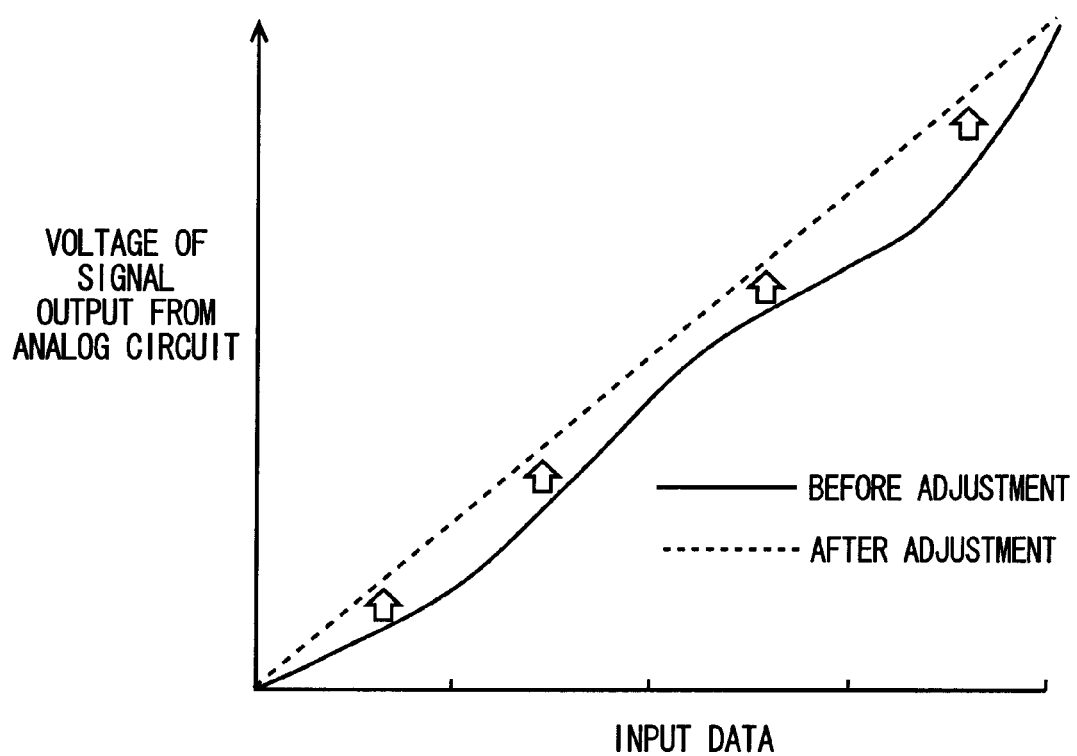
FIG. 5 shows an example of voltage of the signal output from the analog circuit 100 relative to the input data in the signal generating apparatus 10 according to the present embodiment.

FIG. 5 shows an example of voltage of the signal output from the analog circuit 100 relative to the input data in the signal generating apparatus 10 according to the present embodiment. The control section 26 adjusts the output voltage of the DA converter 20 according to the input data based on the voltage of the signal output from the analog circuit 100 that is detected as described above.

For example, when prescribed input data is supplied to the signal generating apparatus 10, the control section 26 may adjust the output voltage of the DA converter 20 such that the voltage of the signal output form the analog circuit 100 becomes a predetermined voltage. For example, the control section 26 may adjust the output voltage of the DA converter 20 as shown in FIG. 5, such that a linear characteristic of the voltage of the signal output from the analog circuit 100 relative to the input data is within a predetermined range.

The DA converter 20 may correct the input data from the outside using a digital computation, and output an output voltage corresponding to the corrected input data. In such a case, the control section 26 adjusts the correction amount for the input data such that the voltage of the signal output from the analog circuit 100 has a predetermined characteristic.

For example, the signal generating apparatus 10 may include a main DA converter that generates a main voltage corresponding to the input data from the outside, a data converting section that outputs correction data corresponding to the input data, a sub DA converter that generates a correction voltage corresponding to the correction data, and an adding section that outputs an output voltage obtained by adding together the main voltage and the correction voltage. In such a case, the data converting section references a table or the like to output the correction data corresponding to the input data. The control section 26 then adjusts the correction data generated according to the input data such that the voltage of the signal output from the analog circuit 100 has a predetermined characteristic.

As another example, the DA converter 20 may have input/output characteristics that can be changed from the outside. In such a case, the control section 26 adjusts the input/output characteristics of the DA converter 20 such that the voltage of the signal output from the analog circuit 100 has a predetermined characteristic.

Whichever of the above adjustment methods is used, the control section 26 does not perform the adjustment when the comparison voltage corresponding to the comparison data is output from the DA converter 20. In this way, the control section 26 can measure the distortion, attenuation, or the like caused by the analog circuit 100.

Furthermore, with the above adjustment, the control section 26 may adjust at least one of the gain characteristic and the offset characteristic of the output voltage of the DA converter 20. In this way, the control section 26 can perform the adjustment relatively easily and accurately.

The control section 26 may adjust the gain characteristic of the output voltage from the DA converter 20 in each of a plurality of divided regions obtained by dividing the range of the input data for the DA converter 20. In this way, even when the characteristics of the analog circuit 100 differ depending on the voltage range, the control section 26 can accurately perform the adjustment.

The control section 26 acquires and stores many samples of the detection results of the voltage of the signal output from the analog circuit 100. After statistically processing the detection results of the plurality of stored samples, the control section 26 may adjust the output voltage of the DA converter 20. For example, when a plurality of voltages are detected for the same input data, the control section 26 may adjust the output voltage of the DA converter 20 based on the average result of these detections. In this way, the control section 26 can perform the adjustment more accurately.

The control section 26 may detect the voltage of the signal output from the analog circuit 100 constantly or periodically during actual operation. The control section 26 may detect the voltage of the signal output from the analog circuit 100 on a condition that the change in the input data supplied to the DA converter 20 is no greater than a predetermined amount. In this way, the control section 26 can detect the voltage of the signal output from the analog circuit 100 while the output voltage of the DA converter 20 is in a stable state.

Figure 6:
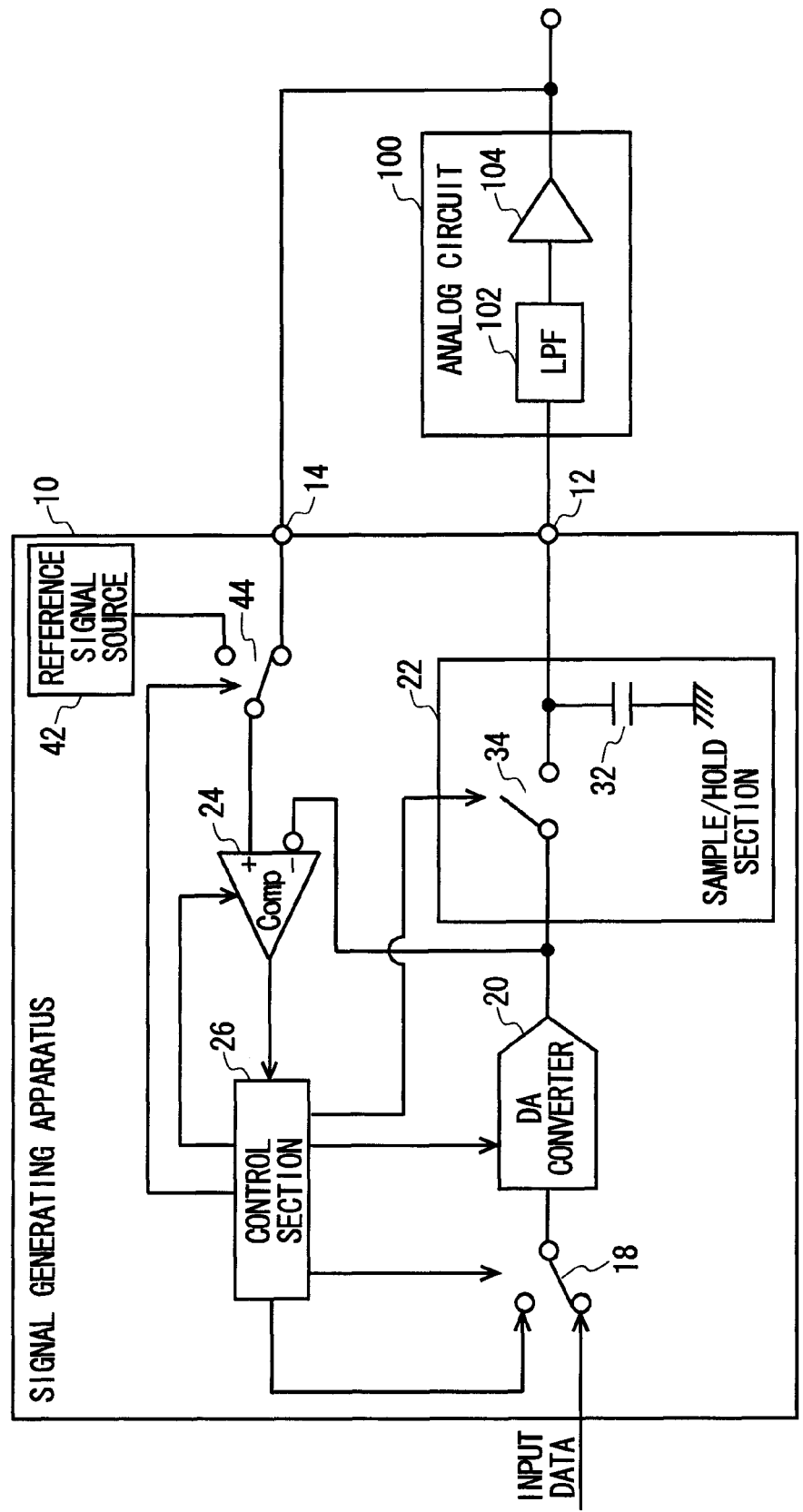
FIG. 6 shows a configuration of the signal generating apparatus 10 according to a first modification of the present embodiment, along with the analog circuit 100.

FIG. 6 shows a configuration of the signal generating apparatus 10 according to a first modification of the present embodiment, along with the analog circuit 100. The signal generating apparatus 10 of the present modification adopts substantially the same function and configuration as the signal generating apparatus 10 shown in FIG. 1, and components of the signal generating apparatus 10 of the present modification have the same function and configuration as components having the same reference numerals in the signal generating apparatus 10 of FIG. 1. Therefore, the following description includes only differing points.

The signal generating apparatus 10 of the present modification further includes a reference signal source 42 and a signal switching section 44. The reference signal source 42 generates a reference voltage. The signal switching section 44 supplies the comparing section 24 with the reference voltage generated by the reference signal source 42, instead of with the signal output by the analog circuit 100 and received via the detection end 14.

In this modification, during the holding period, the control section 26 causes the comparing section 24 to compare the voltage of the signal output by the DA converter 20 to the reference voltage. The control section 26 then adjusts the output voltage of the DA converter 20 based on the comparison result between the voltage of the signal output by the DA converter 20 and the reference voltage.

In this way, during signal generation, the control section 26 can adjust the output voltage of the DA converter 20 based on the reference voltage. The reference signal source 42 may be configured to be able to generate the reference voltage at a plurality of levels. The reference signal source 42 may also be configured to be able to generate both a positive and a negative reference voltage.

Figure 7:
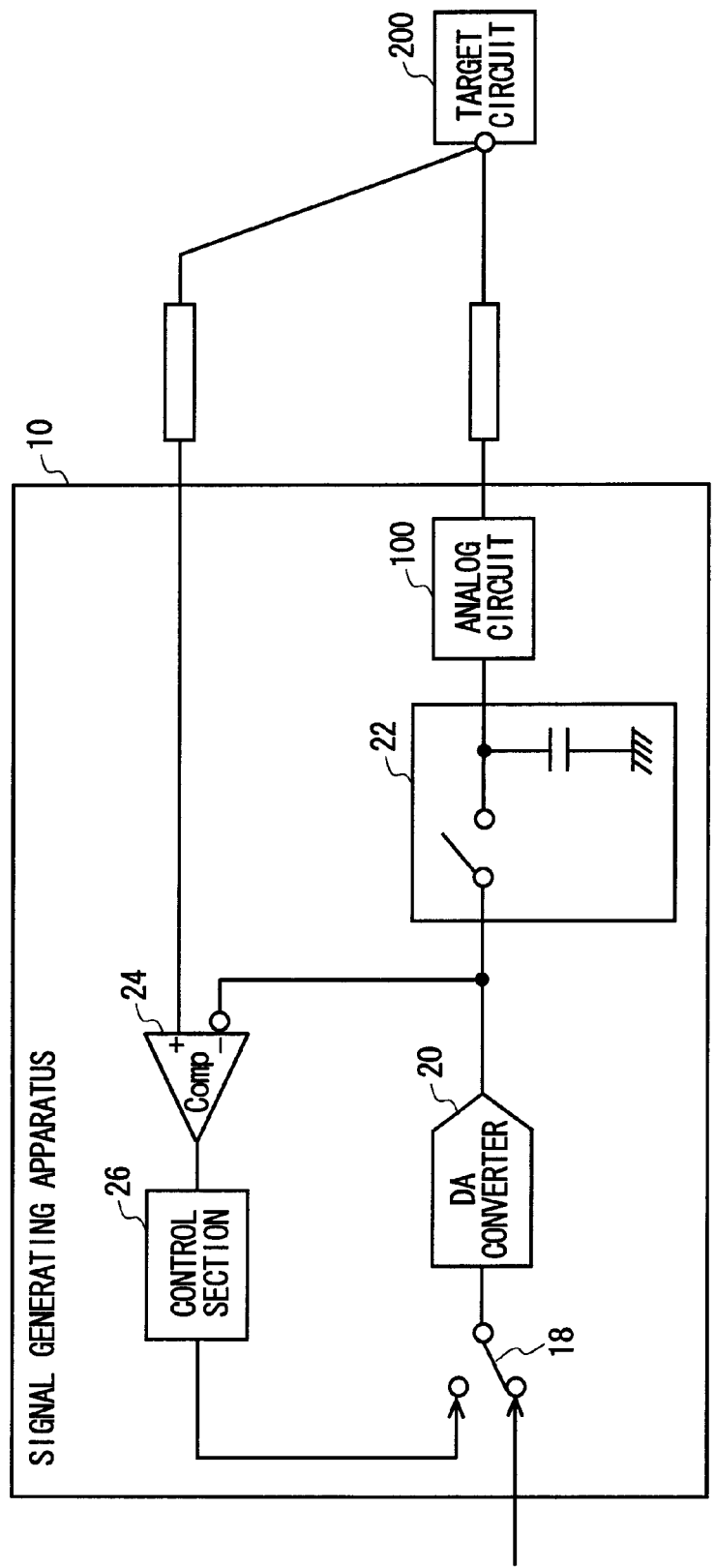
FIG. 7 shows a configuration of the signal generating apparatus 10 according to a second modification of the present embodiment, along with a target circuit 200.

FIG. 7 shows a configuration of the signal generating apparatus 10 according to a second modification of the present embodiment, along with the target circuit 200. The signal generating apparatus 10 of the present modification adopts substantially the same function and configuration as the signal generating apparatus 10 shown in FIG. 1, and components of the signal generating apparatus 10 of the present modification have the same function and configuration as components having the same reference numerals in the signal generating apparatus 10 of FIG. 1. Therefore, the following description includes only differing points.

In the present embodiment, the signal generating apparatus 10 includes the analog circuit 100 therein. The analog circuit 100 propagates the output voltage from the DA converter 20 to an input end of the target circuit 200. The comparing section 24 compares the voltage of the input end of the target circuit 200 to the comparison voltage output from the DA converter 20.

The signal generating apparatus 10 of the present modification can accurately generate the voltage corresponding to the input data at the input end of the target circuit 200. Accordingly, the signal generating apparatus 10 of the present modification can accurately apply the desired voltage to the target circuit 200.

Figure 8:
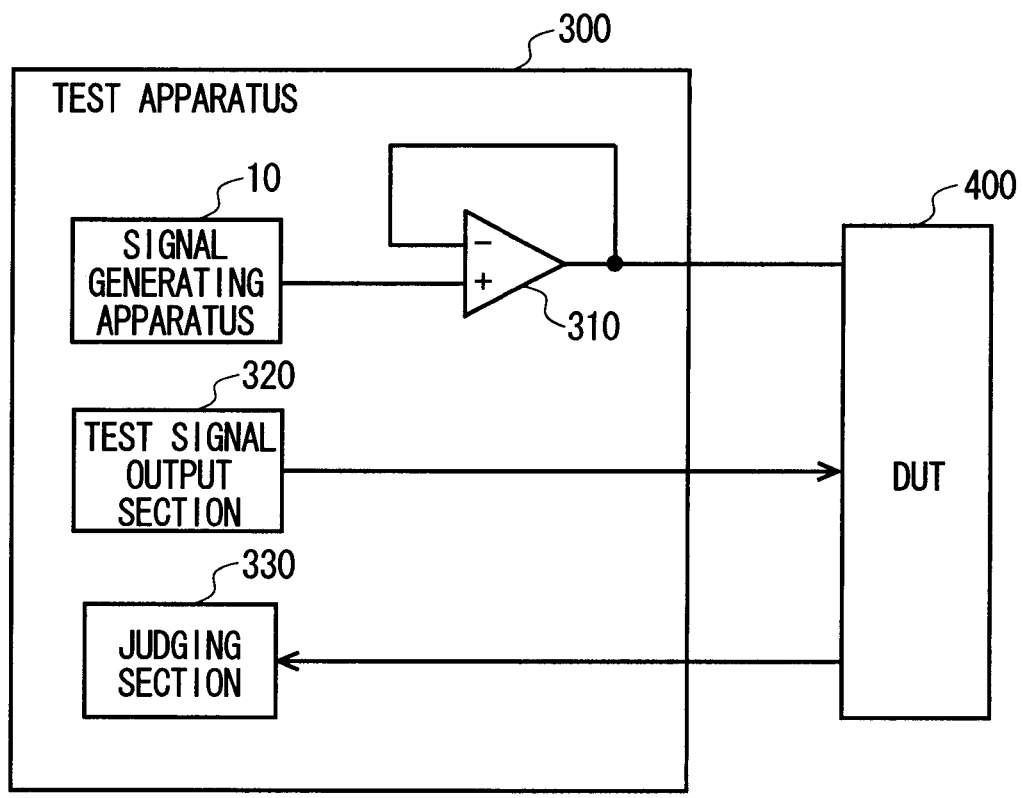
FIG. 8 shows a configuration of a test apparatus 300 according to an embodiment of the present invention, along with a device under test (DUT) 400.

FIG. 8 shows a configuration of a test apparatus 300 according to an embodiment of the present invention, along with a device under test (DUT) 400. The test apparatus 300 tests the device under test 400, which is a semiconductor apparatus or the like.

The test apparatus 300 includes the signal generating apparatus 10, a drive section 310, a test signal output section 320, and a judging section 330. The signal generating apparatus 10 generates voltage that is supplied to the device under test 400. The signal generating apparatus 10 in this embodiment has the same configuration as the signal generating apparatus 10 described in relation to FIGS. 1 to 7, and therefore further description is omitted.

The drive section 310 supplies the device under test 400 with the voltage generated by the signal generating apparatus 10. The drive section 310 may be a power amplifier, for example.

The drive section 310 may be a portion of the analog circuit 100. In other words, the comparing section 24 of the signal generating apparatus 10 may compare the voltage of the output end of the drive section 310 to the comparison voltage output from the DA converter 20.

The test signal output section 320 outputs a test signal to the device under test 400. The judging section 330 receives a response signal from the device under test 400 in response to the test signal. The judging section 330 judges acceptability of the device under test 400 based on the received response signal. The test apparatus 300 described above can supply the device under test 400 with an accurate voltage from the signal generating apparatus 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal generating apparatus comprising:
  a DA converter that outputs an output signal comprising an output voltage corresponding to input data supplied thereto;
  a comparing section that compares (i) a level of a signal output from an analog circuit that propagates the output signal to output a signal corresponding to the input data to (ii) a level of the signal output by the DA converter; and
  a control section that adjusts the output signal of the DA converter based on a comparison result of the comparing section; and
  a sample/hold unit that is provided between the DA converter and an output end of the signal generating apparatus, and that samples an output voltage of the DA converter and holds the sampled output voltage, wherein
  during a holding period in which the sampled output voltage is held, the control section (i) provides the DA converter with comparison data instead of the input data to cause the DA converter to output a comparison voltage corresponding to the comparison data, (ii) causes the comparing section to compare a voltage of the signal output by the analog circuit to the comparison voltage, and (iii) adjusts the output voltage of the DA converter according to the input data based on a comparison result of the comparing section.

2. The signal generating apparatus according to claim 1, wherein the sample/hold unit includes:
  a capacitor section that is provided between the output end of the signal generating apparatus and a reference potential; and
  a switch that provides a connection between the DA converter and the output end of the signal generating apparatus during a sampling period in which the output voltage of the DA converter is sampled, and disconnects the DA converter from the output end of the signal generating apparatus during the holding period.

3. The signal generating apparatus according to claim 2, wherein
  the DA converter repeatedly outputs, for each of a plurality of operational cycles, the output voltage corresponding to the input data supplied thereto,
  for each operational cycle, the sample/hold unit samples the output voltage of the DA converter and holds the sampled output voltage, and
  during the holding period, the control section provides the DA converter with the comparison data instead of the input data to cause the DA converter to output the comparison voltage corresponding to the comparison data, and causes the comparing section to compare the voltage of the signal output by the analog circuit to the comparison voltage.

4. The signal generating apparatus according to claim 3, wherein
the control section changes the comparison data provided to the DA converter and causes the comparing section to output a plurality of comparison results, detects the voltage of the signal output from the analog circuit based on the plurality of comparison results, and adjusts the output voltage of the DA converter according to the input data based on the detected voltage.

5. The signal generating apparatus according to claim 4, wherein
the control section changes the comparison data provided to the DA converter according to a prescribed rule over a plurality of operational cycles.

6. The signal generating apparatus according to claim 4, wherein
the control section changes the comparison data provided to the DA converter according to a prescribed rule within one operational cycle.

7. The signal generating apparatus according to claim 4, wherein
the control section subtracts 1 at a time from or adds 1 at a time to the comparison data provided to the DA converter, which has a value corresponding to the input data provided to the DA converter.

8. The signal generating apparatus according to claim 4, wherein
the control section changes the comparison data provided to the DA converter according to rules of a binary search.

9. The signal generating apparatus according to claim 4, wherein
the control section detects the voltage of the signal output from the analog circuit on a condition that a change in the input data provided to the DA converter is no greater than a predetermined amount.

10. The signal generating apparatus according to claim 1, further comprising the analog circuit.

11. The signal generating apparatus according to claim 1, wherein
the control section adjusts at least one of a gain characteristic and an offset characteristic of the output voltage from the DA converter.

12. The signal generating apparatus according to claim 11, wherein
the signal generating apparatus adjusts the gain characteristic of the output voltage from the DA converter for each of a plurality of divided regions obtained by dividing a range of the input data of the DA converter.

13. The signal generating apparatus according to claim 1, further comprising a reference signal source that generates a reference voltage, wherein
the control section adjusts the output voltage of the DA converter based on a comparison result between the voltage of the signal output by the DA converter and the reference voltage.

14. The signal generating apparatus according to claim 1, wherein
the analog circuit propagates the output voltage of the DA converter to an input end of a target circuit, and the comparing section compares the voltage of the input end of the target circuit to the comparison voltage output by the DA converter.

15. A test apparatus that tests a device under test, comprising:
the signal generating apparatus according to claim 1 that generates a voltage provided to the device under test; and
a drive section that supplies the device under test with the voltage generated by the signal generating apparatus.

16. The test apparatus according to claim 15, wherein the drive section comprises a power amplifier.

17. The test apparatus according to claim 15, wherein
the drive section is a portion of the analog circuit, and
the comparing section compares the voltage of the output end of the drive section to the comparison voltage output from the DA converter.

18. The test apparatus according to claim 15, further comprising:
a test signal output section that outputs a test signal to the device under test.

19. The test apparatus according to claim 18, further comprising:
a judging section that receives a response signal from the device under test in response to the test signal and judges acceptability of the device under test based on the received response signal.

20. The test apparatus according to claim 15, wherein the device under test is a semiconductor apparatus.

* * * * *